US006556398B1

(12) United States Patent
Chen

(10) Patent No.: US 6,556,398 B1
(45) Date of Patent: Apr. 29, 2003

(54) VOLTAGE TOLERANCE ESD PROTECTION CIRCUIT

(75) Inventor: Wei-Fan Chen, Taichung (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/543,873

(22) Filed: Apr. 6, 2000

(30) Foreign Application Priority Data

Oct. 5, 1999 (TW) .................................... 088117119 A

(51) Int. Cl.[7] .................................................. H02H 9/00

(52) U.S. Cl. ......................... 361/56; 361/91.1; 361/111

(58) Field of Search .......................... 361/56, 91.1, 111, 361/91.2, 91.5

(56) References Cited

U.S. PATENT DOCUMENTS 5,311,391 A * 5/1994 Dungan et al. ............... 361/56
5,617,283 A * 4/1997 Krahauer et al. ............. 361/56
5,719,737 A * 2/1998 Maloney ..................... 361/111
6,069,782 A * 5/2000 Lien et al. .................. 361/111

* cited by examiner

*Primary Examiner*—Stephen W. Jackson
(74) *Attorney, Agent, or Firm*—Fish & Richardson P.C.

(57) ABSTRACT

The present invention provides an ESD protection circuit for preventing an internal circuit from being damaged by ESD, wherein the internal circuit is connected to a pad. The ESD protection circuit comprises a first transistor, a second transistor and a voltage divider. The first transistor has a drain connected to the pad. The second transistor has a source and a gate both connected to an input node for a supply voltage, and has a drain connected to a source of the first transistor. The voltage divider is connected between the pad and the input node for the supply voltage, and also connected to a gate of the first transistor for providing a bias voltage thereto when ESD occurs.

9 Claims, 3 Drawing Sheets

11
Internal circuit
17
23
20
21
13
$V_g$
25
15
$V_{SS}$
$V_{SS}$

VOLTAGE TOLERANCE ESD PROTECTION CIRCUIT

BACKGROUND OF THE INVENTION

1. Field of the Invention

The present invention relates to an ESD protection circuit with high performance.

2. Description of the Prior Art

With the continuous scaling down of VLSI feature size, VLSI circuit manufacturers are making semiconductor devices with thinner gate oxide layers to meet the scale down rule and increase device performance. Therefore, VLSI gate layer thickness is being continuously reduced. The gate oxide thickness in the present technology is approximately 60 angstrom for deep half-micro meter technology. Nordheim-Fowler tunneling current is found at the 7M/cm electric field across gate oxide regions. Thus, a semiconductor MOS device cannot sustain an electric field greater than 7MV/cm across gate oxide regions without being damaged over time. Consequently, the maximum voltage across gate oxide regions of a 60-angstrom thickness MOS transistor without suffering damage over time is 60 Å×7M/cm=4.2V. In practice, the maximum voltage is smaller than 4.2V due to process variables, such as defects.

This low gate oxide thickness will especially cause problems in I/O and ESD protection circuits. For some core elements, for example a microprocessor, feature dimensions and operation speeds are smaller and faster than those of periphery devices, for example an RS232 interface. The power supply and voltage swing needed for core elements are also getting smaller than those needed for periphery circuits. Moreover, the I/O circuits run at a higher voltage than the core circuits. Accordingly, a voltage higher than the supply voltage may be applied to some of the gate oxide regions with uniform thickness, which causes problems in gate oxide reliability.

To avoid the above problems, various kinds of ESD protection circuit have been proposed. An ESD protection circuit is provided in U.S. Pat. No. 5,532,178, which uses an undoped silicon poly gate as an ESD transistor so that the ESD protection transistor can withstand a voltage higher than the supply voltage. However, this results in an Lunstable Vt and a need for additional masks. Another ESD protection circuit is provided in U.S. Pat. No. 5,696,397, which comprises a parasitic MOS transistor, but does not provide for full swing. Moreover, a depletion MOS transistor is used in the ESD protection circuit provided in U.S. Pat. No. 5,495,185, but increases the complexity of process.

FIG.1 is a block diagram showing a traditional ESD protection circuit 10. The ESD protection circuit 10 comprises a pad 11 and two transistors 13, 15. An internal circuit 17 is connected to the ESD protection circuit 10 to be protected from damage by ESD. The transistor 13 has a drain connected to the pad 11 and a gate connected to an input node for a supply voltage Vdd. The transistor 15 has a drain connected to the source of the transistor 13, and a gate and a source both connected to an input node for a supply voltage Vss. However, when ESD occurs and the supply voltage Vdd is not applied, the transistor 13 will be turned off. Thus, the long distance between the drain of the transistor 15 and the source of the transistor 13 will result in an undesirable : gain of the lateral NPN and therefore decrease the ESD capability. In addition, the drain of the transistor 15 will be floating and there will be no net current flowing from the drain to the source of the transistor 15. Therefore, hot electron accelerated avalanche breakdown will never occur in the transistor 15, which will result in a high avalanche voltage and further decrease the ESD capability.

SUMMARY OF THE INVENTION

The object of the present invention is to solve the above-mentioned problems and to provide an ESD protection circuit in which a bias voltage resulting from the occurrence of ESD is applied to the gate of the transistor 13 so that the transistor 13 is turned on upon the occurrence ESD.

To achieve the above-mentioned object, the present invention provides an ESD protection circuit for preventing an internal circuit from being damaged by ESD, wherein the internal circuit is connected to a pad. The ESD protection circuit comprises a first transistor, a second transistor and a voltage divider. The first transistor has a drain connected to the pad. The second transistor has a source and a gate both connected to an input node for a supply voltage, and has a drain connected to a source of the first transistor. The voltage divider is connected between the pad and the input node for the supply voltage, and also connected to a gate of the first transistor for providing a bias voltage thereto when ESD occurs.

The present invention also provides an ESD protection circuit for preventing an internal circuit from being damaged by ESD, wherein the internal circuit is connected to a pad. The ESD protection circuit comprises a first transistor, a second transistor and a voltage divider. The first transistor has a drain connected to the pad. The second transistor has a source and a gate both connected to an input node for a supply voltage, and has a drain connected to a source of the first transistor: The voltage divider is connected between the pad and the input node for the supply voltage, and comprises an upper load and a lower load connected in series. The upper load and lower load are also connected to the pad and the input node for the supply voltage respectively. The gate of the first transistor is connected to where the upper load and lower load are connected together for receiving a bias voltage when ESD occurs.

Accordingly, the present invention solves the above-mentioned problems by providing a voltage divider which, upon the occurrence of ESD, provides a bias voltage to the gate of the first transistor and therefore turning on the first transistor, thus maintaining a high ESD capability.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 2:
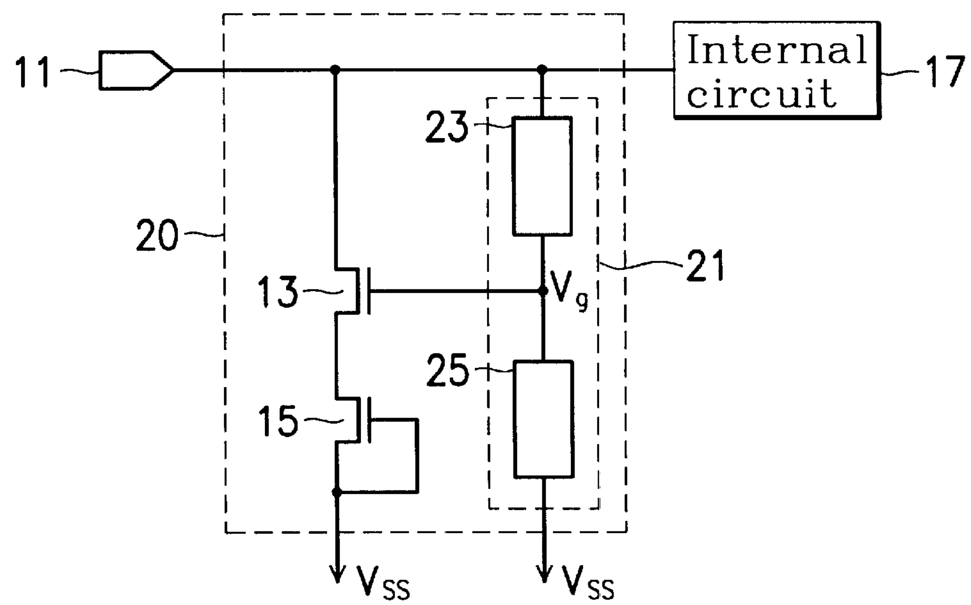
FIG. 2 is a block diagram showing an ESD protection circuit of a first embodiment according to the invention.

FIG. 2 is a block diagram showing an ESD protection circuit 20 of a first embodiment according to the invention.

Figure 1:
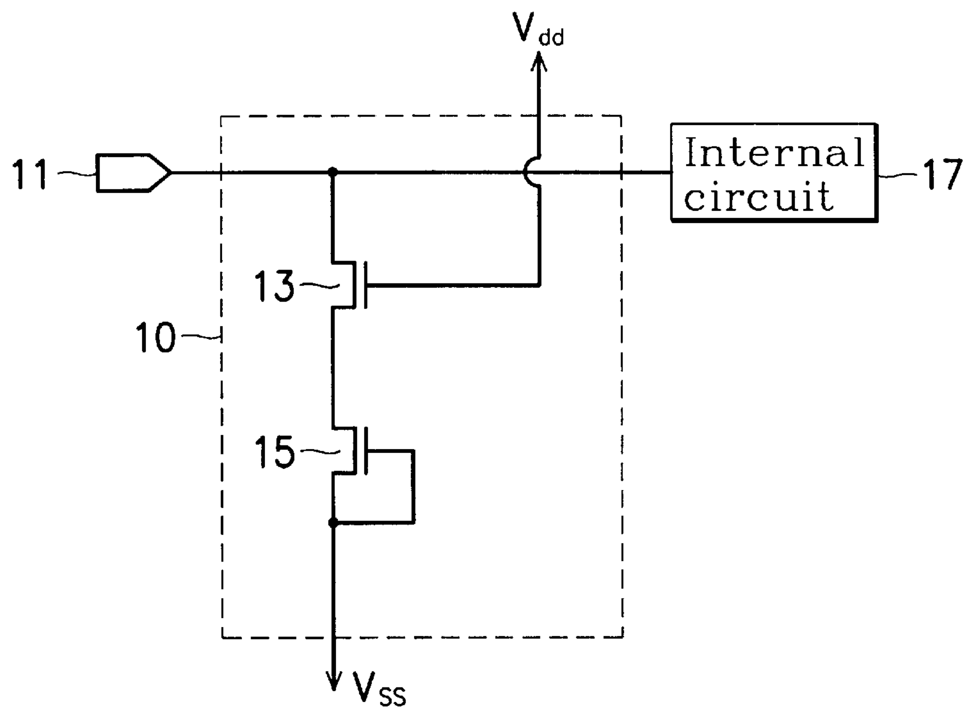
FIG. 1 is a block diagram showing a traditional ESD protection circuit.

The same elements in FIG. 1 and FIG. 2 are referred to by the same number. The ESD protection circuit 20 comprises two transistors 13, 15 and a voltage divider 21. The ESD protection circuit 20 and an internal circuit 17 are both connected to a pad 11. The voltage divider 21 comprises an upper load 23 and a lower load 25. By comparing to the ESD protection circuit 10 in FIG. 1, it is noted that an additional voltage divider 21 is connected between Vss and the pad 11, and the gate of the transistor 13 is connected to where the upper and lower load are connected together rather than Vdd.

When the pad 11 suffers ESD, the voltage divider 21 receives a high voltage from the pad 11 and outputs a voltage Vg divided from the received high voltage by the upper load 23 and lower load 25. Then, Vg is applied to the gate of the transistor 13 and turns on the transistor 13. Therefore, ESD flows through the transistor 13 and 15, which prevents the internal circuit 17 from being damaged by ESD.

Meanwhile, since the transistor 13 is turned on upon the occurrence of ESD, the undesirable $\beta$ gain of the lateral NPN and the high avalanche voltage presented in the prior art are eliminated, thereby achieving a better ESD capability.

Figure 3:
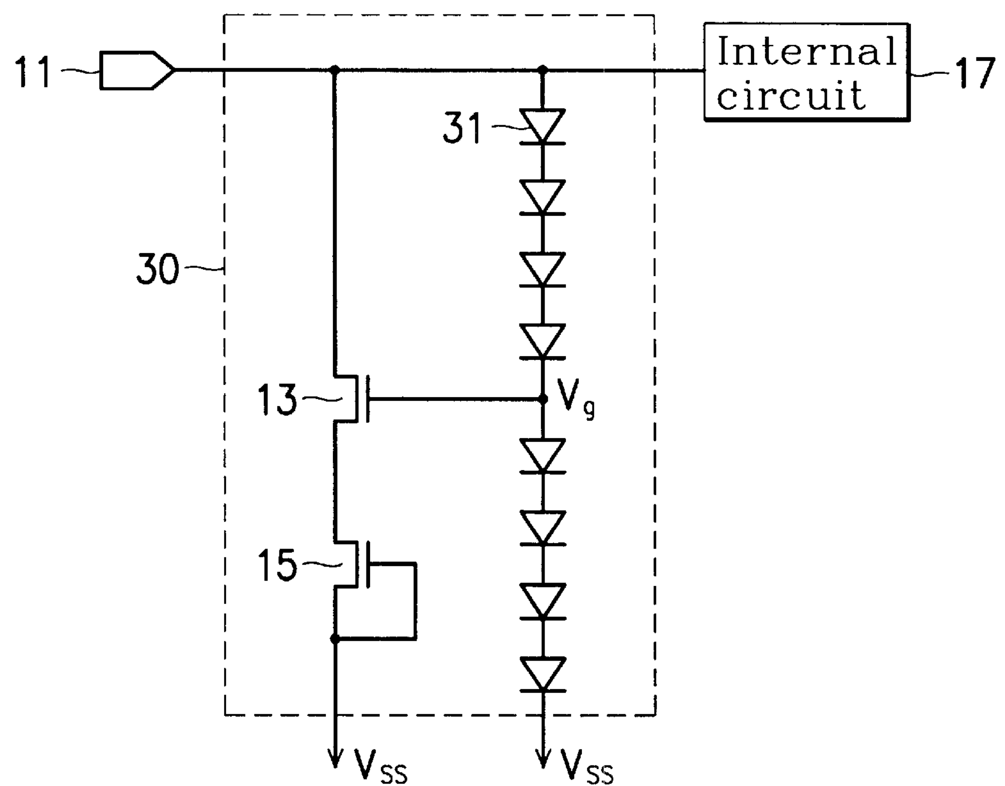
FIG. 3 is a block diagram showing an ESD protection circuit of a second embodiment according to the invention.

FIG. 3 is a block diagram showing an ESD protection circuit 30 of a second embodiment according to the invention. The same elements in FIG. 1 and FIG. 3 are referred to by the same number. In the ESD protection circuit 30, it is noted that the configuration and operation are similar to those of the ESD protection circuit 20 in FIG.2, except that the upper load 23 and lower load 25 are implemented with diodes 31 connected in series. The sum of the cut-in voltages of diodes 31 is larger than the maximum operation voltage on the pad 11 so that the ESD protection circuit 30 does not work during the normal operation of the internal circuit 17. On the other hand, during the occurrence of ESD, all the diodes 31 are turned on and the gate of the transistor 13 receives a voltage Vg which is approximately equal to the sum of the cut-in voltages of the diodes in the lower load.

In FIG. 3, although the upper load and lower load are both implemented with four diodes, it is not necessary for the number of the diodes to be 4. The number of the diodes is determined so that the sum of their cut-in voltages is larger than the maximum operation voltage on the pad.

Figure 4:
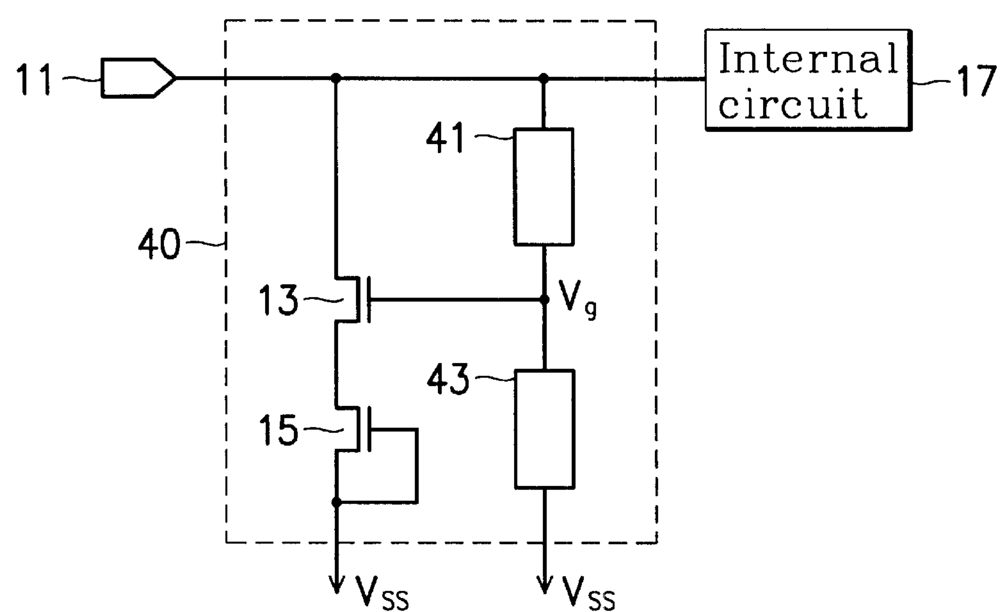
FIG. 4 is a block diagram showing an ESD protection circuit of a third embodiment according to the invention.

FIG. 4 is a block diagram showing an ESD protection circuit of a third embodiment according to the invention. The same elements in FIG. 1 and FIG. 4 are referred to by the same number. In the ESD protection circuit 40, it is noted that the configuration and operation are similar to those of the ESD protection circuit 20 in FIG. 2, except that the upper load 23 and lower load 25 are respectively implemented with passive impedance 41 and 43. The passive impedance may be resistance or capacitance.

Figure 5:
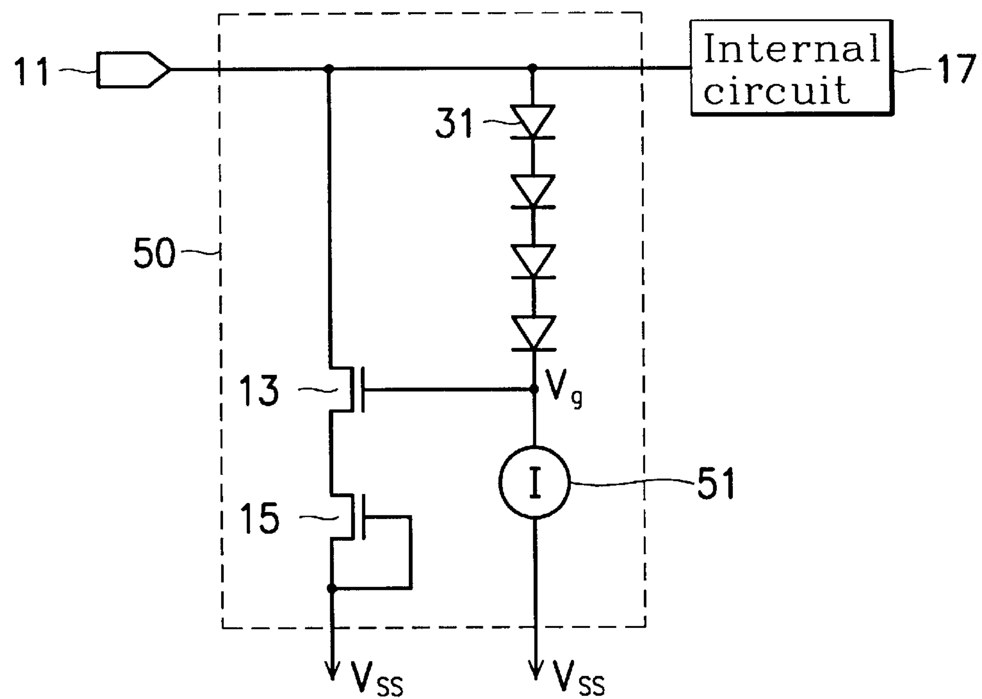
FIG. 5 is a block diagram showing an ESD protection circuit of a fourth embodiment according to the invention.

FIG. 5 is a block diagram showing an ESD protection circuit of a fourth embodiment according to the invention. The same elements in FIG. 1 and FIG. 5 are referred to by the same number. In the ESD protection circuit 50, it is noted that the configuration and operation are similar to those of the ESD protection circuit 20 in FIG. 2, except that the upper load 23 and lower load 25 are respectively implemented with a series of diodes 31 and a current source 51. The current source 51 provides a constant current flowing through the series of diodes 31 upon the occurrence ESD. Thus, Vg is derived by subtracting the sum of the cut-in voltages of the series of diodes 31 from the high voltage induced by ESD on pad 11.

Similarly, in FIG. 5, although the upper load is implemented with four diodes, it is not necessary for the number of the diodes to be 4. The number of the diodes is determined so that the sum of their cut-in voltages is larger than the maximum operation voltage on the pad.

Figure 6:
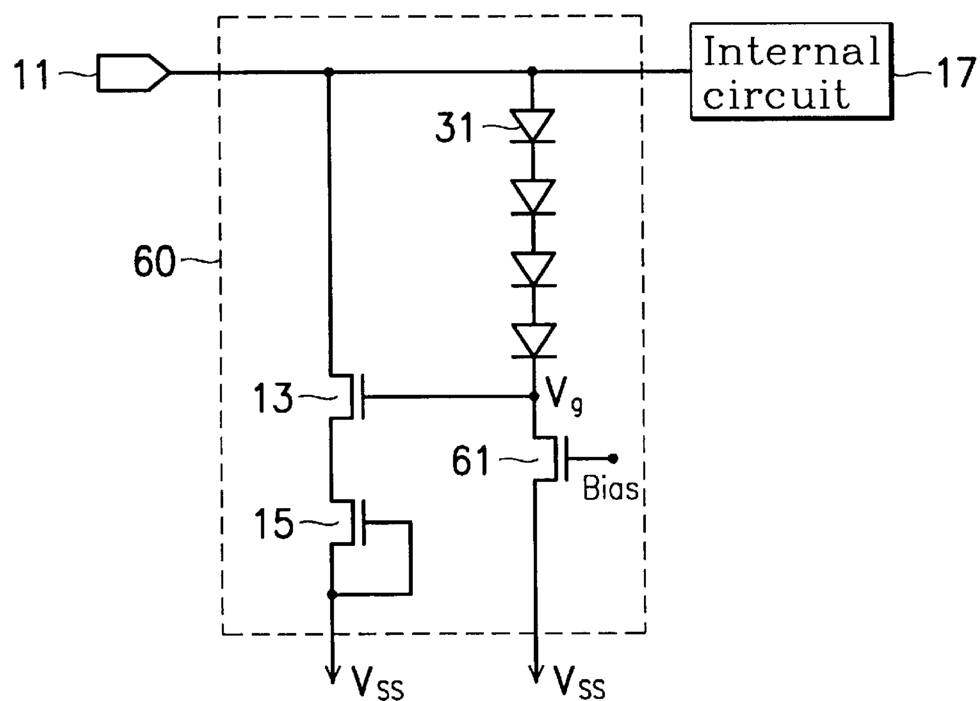
FIG. 6 is a block diagram showing an ESD protection circuit of a fifth embodiment according to the invention.

FIG. 6 is a block diagram showing an ESD protection circuit of a fifth embodiment according to the invention. The same elements in FIG. 1 and FIG. 6 are referred to by the same number. In the ESD protection circuit 60, it is noted that the configuration and operation are similar to those of the ESD protection circuit 50 in FIG. 5, except that the current source 51 is implemented with a transistor 61 under a subthreshold bias condition. Upon the occurrence of ESD, a voltage Bias is applied to the gate of the transistor 61 so that the transistor 61 is in subthresold. Thus, the transistor 61 is used as a current source.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An ESD protection circuit for preventing an internal circuit from being damaged by ESD, wherein the internal circuit is connected to a pad, the ESD protection circuit comprising:

a first transistor having a drain connected to the pad and through which ESD flows when the pad suffers ESD;

a second transistor having a source and gate both connected to an input node for a supply voltage and having a drain coupled to a source of the first transistor; and a voltage divider connected between the pad and the input node for the supply voltage, comprising an upper load and an lower load connected in series, the upper load and lower load also being coupled to the pad and the input node for the supply voltage respectively, and the gate of the first transistor being connected to where the upper load and lower load are connected together for receiving a bias voltage when ESD occurs.

2. The ESD protection circuit as claimed in claim 1, wherein the second transistor has a gate connected to the input node for the supply voltage.

3. The ESD protection circuit as claimed in claim 1, wherein the upper load comprises a plurality of diodes connected in series.

4. The ESD protection circuit as claimed in claim 1, wherein the lower load comprises a plurality of diodes connected in series.

5. The ESD protection circuit as claimed in claim 1, wherein the upper load comprises a resistance.

6. The ESD protection circuit as claimed in claim 1, wherein the lower load comprises a resistance.

7. The ESD protection circuit as claimed in claim 1, wherein the lower load comprises a current source.

8. The ESD protection circuit as claimed in claim 1, wherein the current source comprises a transistor under a subthreshold bias condition.

9. The ESD protection circuit as claimed in claim 1, wherein the upper load and lower load both comprise a capacitance.

* * * * *